(12) United States Patent
Dupont

(10) Patent No.: US 10,101,907 B2
(45) Date of Patent: Oct. 16, 2018

(54) DATA TRANSMISSION SYSTEM AND RELATIVE POSITION DATA STRUCTURE

(71) Applicant: CYBORG INC., New York, NY (US)

(72) Inventor: Nicolas Thomas Mathieu Dupont, Montverde, FL (US)

(73) Assignee: Cyborg Inc., New York, NY (US)

( * ) Notice: Subject to any disclaimer, the term of this patent is extended or adjusted under 35 U.S.C. 154(b) by 0 days.

(21) Appl. No.: 15/891,939

(22) Filed: Feb. 8, 2018

(65) Prior Publication Data

US 2018/0225040 A1   Aug. 9, 2018

Related U.S. Application Data

(60) Provisional application No. 62/456,637, filed on Feb. 8, 2017.

(51) Int. Cl.
*H03M 1/12*  (2006.01)
*G06F 3/05*  (2006.01)
*H03M 1/66*  (2006.01)

(52) U.S. Cl.
CPC .......... *G06F 3/05* (2013.01); *H03M 1/12* (2013.01); *H03M 1/66* (2013.01)

(58) Field of Classification Search
CPC .................................. H03M 1/12; H03M 1/66
USPC .................................................. 341/150–160
See application file for complete search history.

(56) References Cited

U.S. PATENT DOCUMENTS

| | | | | |
|---|---|---|---|---|
| 6,912,351 B1* | 6/2005 | Kim | ...................... | G11B 20/10 375/240.03 |
| 7,822,794 B2* | 10/2010 | Ono | ...................... | G11B 20/10 707/821 |
| 7,859,579 B2* | 12/2010 | Iida | ...................... | G11B 27/34 348/231.3 |
| 8,107,787 B2* | 1/2012 | Iida | .................... | H04N 1/00127 352/11 |
| 9,871,530 B1* | 1/2018 | La Grou | ................ | H03M 1/66 |

* cited by examiner

*Primary Examiner* — Lam T Mai
(74) *Attorney, Agent, or Firm* — Cooley LLP

(57) ABSTRACT

A system includes a non-transitory memory, a processor in operable communication with the memory, a digital-to-analog converter (DAC) and a transmitter. The memory stores bit position information associated with a first data. The bit position information includes absolute position data and relative position data for each bit of a plurality of bits of the first data. The processor can receive a data stream including the first data, and compress the first data to generate a second data representing the first data. The second data has a data structure that is arranged based on: (1) the first data, and (2) the bit position information. The DAC can receive a digital representation of the second data from the processor and convert the digital representation of the second data into an analog representation of the second data. The transmitter can then transmit the analog representation of the second data.

19 Claims, 17 Drawing Sheets

Water 1  2  3  4  5

FIG. 11

| | $a_a$ | $a_b$ | $r$ |
|---|---|---|---|
| C1: | $a_1$ | $a_1$ | $r_1$ |
| C2: | $a_1$ | $a_2$ | $r_2$ |
| C3: | $a_1$ | $a_3$ | $r_3$ |
| C4: | $a_1$ | $a_4$ | $r_4$ |
| C5: | $a_2$ | $a_1$ | $r_5$ |
| C6: | $a_2$ | $a_2$ | $r_6$ |
| C7: | $a_2$ | $a_3$ | $r_7$ |
| C8: | $a_2$ | $a_4$ | $r_8$ |
| C9: | $a_3$ | $a_1$ | $r_9$ |
| C10: | $a_3$ | $a_2$ | $r_{10}$ |
| C11: | $a_3$ | $a_3$ | $r_{11}$ |
| C12: | $a_3$ | $a_4$ | $r_{12}$ |
| C13: | $a_4$ | $a_1$ | $r_{13}$ |
| C14: | $a_4$ | $a_2$ | $r_{14}$ |
| C15: | $a_4$ | $a_3$ | $r_{15}$ |
| C16: | $a_4$ | $a_4$ | $r_{16}$ |

C1–C16 braced as $n^2$

FIG. 14

| $a_a$ | $a_b$ | r |
|---|---|---|
| D1: 00 | 00 | 0000 |
| D2: 00 | 01 | 0001 |
| D3: 00 | 10 | 0010 |
| D4: 00 | 11 | 0011 |
| D5: 01 | 00 | 0100 |
| D6: 01 | 01 | 0101 |
| D7: 01 | 10 | 0110 |
| D8: 01 | 11 | 0111 |
| D9: 10 | 00 | 1000 |
| D10: 10 | 01 | 1001 |
| D11: 10 | 10 | 1010 |
| D12: 10 | 11 | 1011 |
| D13: 11 | 00 | 1100 |
| D14: 11 | 01 | 1101 |
| D15: 11 | 10 | 1110 |
| D16: 11 | 11 | 1111 |

DATA TRANSMISSION SYSTEM AND RELATIVE POSITION DATA STRUCTURE

CROSS-REFERENCE TO RELATED APPLICATIONS

This application claims priority to and the benefit of U.S. Provisional Patent Application No. 62/456,637, filed Feb. 8, 2017 and titled "Data Transmission System and Relative Position Data Structure," which is incorporated herein by reference in its entirety.

BACKGROUND

Data is often transferred between two or more digital devices in the form of bits. A bit is a unit of information (a "binary digit") based on the binary logarithm, and has state values that are typically represented as 0's and 1's.

SUMMARY

In some embodiments, a system includes a non-transitory memory, a processor in operable communication with the memory, a digital-to-analog converter (DAC) and a transmitter. The memory stores bit position information associated with a first data. The bit position information includes absolute position data and relative position data for each bit of a plurality of bits of the first data. The processor can receive a data stream including the first data, and compress the first data to generate a second data representing the first data. The second data has a data structure that is arranged based on: (1) the first data, and (2) the bit position information. The DAC can receive a digital representation of the second data from the processor and convert the digital representation of the second data into an analog representation of the second data. The transmitter (e.g., including an antenna, a coaxial cable, and/or an optical fiber) can then transmit the analog representation of the second data. The transmission of the second data can be wireless or over wire (wired), and/or can be an optical transmission.

In some embodiments, the relative position data for each bit from the plurality of bits of the first data represents comparisons of that bit with each other bit from the plurality of bits of the first data.

In some embodiments, the memory stores a plurality of addressable records, each specifying an ordering of bit comparisons. The processor can be configured to compress the first data based on the ordering of bit comparisons.

In some embodiments, a method includes receiving, at a processor, a data stream including a first data. The processor can transform the first data into a second data including a compressed version of the first data, the second data having a data structure that is arranged based on: (1) the first data and (2) relative bit position information. The processor can then send a digital representation of the second data to a converter that causes the second data to be transmitted after receiving the second data. The transmission of the second data can be wireless or over wire (wired), and/or can be an optical transmission. The transforming can include partitioning the second data into a plurality of symbol sequences having a length that is compatible with the converter.

In some embodiments, a system includes a non-transitory memory, a receiver, an analog-to-digital converter (ADC, also referred to as a "converter"), and a processor in operable communication with the memory and the ADC. The receiver can include one or more of an antenna, a coaxial cable, or an optical fiber. The memory can store bit position information associated with a first data. The bit position information can represent relative positions of each bit of a plurality of bits of the first data, with respect to each other bit of the plurality of bits. The receiver can receive an analog representation of a first data. The ADC can receive the analog representation of the first data from the receiver and convert the analog representation of the first data into a digital representation of the first data. The processor can receive the digital representation of the first data from the ADC, and decompress the first data to generate a second data based on: (1) the first data, and (2) the bit position information.

In some embodiments, the memory includes one of a hash table or a C++ Standard Template Library (STL), and stores a plurality of records, each record of the plurality of records specifying an ordering of bit comparisons for at least one of data compression or data decompression.

In some embodiments, a method includes receiving, at a processor and from an analog-to-digital converter (ADC), a digital representation of a first data, the first data including a plurality of symbols and a header. The header can include a reference to a record of an addressable repository/memory (e.g., a hash table), where each record of a plurality of records in the repository contains ordering instructions (e.g., an ordering of bit comparison) for data compression and/or decompression. The header can have a length that is based on the number of symbols in the plurality of symbols. The digital representation of the first data can be stored in a non-transitory memory that is in operable communication with the processor. The processor can decompress the first data into a second data based on: (1) the first data, and (2) relative bit position information stored in the memory, the bit position information including relative positions of each bit from a plurality of bits of the first data with respect to each other bit from the plurality of bits.

In some embodiments, the method further includes waiting until a predetermined number of symbols have been stored in the memory before decompressing the first data into the second data.

In some embodiments, decompressing the first data includes comparing each symbol from the plurality of symbols with each other symbol from the plurality of symbols. In such embodiments, the header can specify an ordering of the comparing, which itself can be based on a number of bits in each symbol from the plurality of symbols.

In some embodiments, a system includes a non-transitory memory, a processor in operable communication with the memory, and a transmitter. The memory stores bit position information associated with a first data, the bit position information including absolute position data and relative position data for each bit of a plurality of bits of the first data. The processor is configured to receive a data stream including the first data, and to compress the first data to generate a second data representing the first data, the second data having a data structure that is arranged based on: (1) the first data, and (2) the bit position information. The transmitter can then transmit the second data. In some such embodiments, the memory includes one of a hash table or a C++ Standard Template Library (STL), and stores a plurality of records, each record of the plurality of records specifying an ordering of bit comparisons for at least one of data compression or data decompression.

BRIEF DESCRIPTION OF THE DRAWINGS

FIG. 11 illustrates a logic model for an information structure, in accordance with an embodiment.

FIG. 14 shows a tabulation of a series of comparisons of bits within the sequence of FIG. 13.

FIG. 16 shows a tabulation of a series of comparisons of bits within the sequence defined in FIG. 15.

DETAILED DESCRIPTION

Embodiments of the present disclosure include systems and methods for transmitting data at an increased speed over previous methods, whether the data is being transmitted between/among multiple terminals, or is being internally processed within the same terminal.

Known data transmission technologies have been bounded by upper throughput limits due to a practice that may be referred to as "individual symbol scope," meaning that when data is transmitted, it is handled on a one-to-one processing rate, where the transcoding apparatus will only process a single symbol (modulation) at a time. As such, individual symbol scope is limited to assessing absolute position, and therefore each symbol will only contain information about its own content, in a 1:1 ratio. Using such schemes, no information is transmitted beyond what is contained in each symbol by itself.

By contrast, data transmission embodiments of the present disclosure use "relative positioning" such that not only will each symbol contain information about its own content, but also information about every other symbol within its assembled data sequence, making the information transmitted by the symbol exponentially larger. In other words, the increased amount of information per symbol results in an increased effective symbol size, which in turn results in exponentially greater throughput. When this concept is applied to every symbol in a networking system, the resulting system bandwidth increases considerably.

Unique data structures set forth herein are designed to fundamentally improve the way a computer stores and retrieves data in memory for transmission. As explained in further detail below, this can be accomplished using a data structure that represents data in a different way than known structures. In some embodiments, the system is a data transmission system that includes a data structure that allows for data to be arranged based on information stored about the "relative positions" of bits in a data stream, i.e., the positions of each bit relative to one or more neighboring or near neighbor bits, rather than an absolute position alone. Broadly speaking, the data structure arranges data based on individual bits' relative position to other bits in a given bit pattern. In the past, a bit pattern, for example 01001011, could only be described as "01001011". According to the systems and methods set forth herein, this same bit pattern can be used to represent not just 8 bits, but 32 bits of data if every bit in the pattern included stored information about that bit's position relative to other bits. The systems and methods for generating, compressing and decompressing data structures based on relative positioning can facilitate unprecedented compression ratio and data throughput.

Figure 1A:
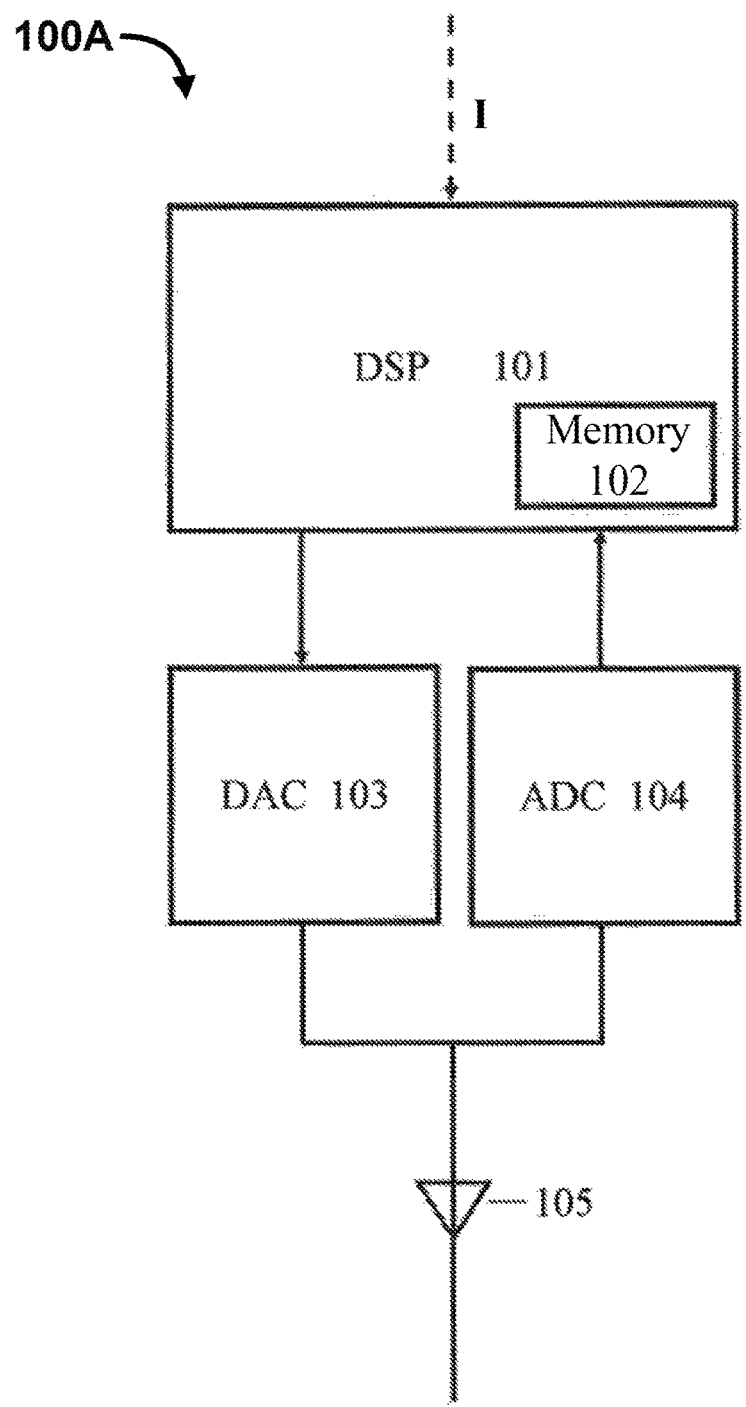
FIG. 1A is a diagram of a system for wireless transmission and reception of data using variable radio frequencies, in accordance with an embodiment.

FIG. 1A is a diagram showing an example hardware architecture of a system 100A for transmitting data wirelessly, according to an embodiment. The digital signal processor (DSP) 101 is configured to receive digital data input "I," and to run a processing sequence to begin an encoding process. The encoding process can be triggered by a detection of the data input I. During encoding, the received data is temporarily stored on the DSP 101's internal storage (e.g., flash storage, one or more internal registers, dynamic random access memory (DRAM), etc.) 102 (also referred to herein as a "repository"), which can subsequently be cleared for a next data sequence. The DSP 101 can be configured to handle both encoding and decoding processes, either simultaneously or serially. For the encoding process, digital data is sent from the DSP 101 to a digital-to-analog converter ("DAC," also referred to as a converter) 103. Within the DAC 103, discrete/digital data sets are converted into corresponding analog voltages of varying frequency, amplitude, and/or phase. The analog-to-digital converter ("ADC") 104 performs the reverse operation, converting analog voltages into discrete/digital data sets for further processing and decoding. The analog voltages can be both transmitted and received via an antenna 105.

In some embodiments, the DSP 101 performs its data processing according to preprogrammed execution orders, such as those shown and discussed with reference to FIGS. 7 and 8 below. The DAC 103 and the ADC 104 are configured to operate on a preset radio frequency baseband, which allows for selective processing and the potential use of multiple channels. When a discrete/digital data set is sent to the DAC 103 for conversion, the corresponding analog signal is sent, with its particular frequency, amplitude, and/or phase relative to the system's baseband frequency (e.g., 2.4 GHz). Likewise, when an analog signal reaches the ADC 104 (via antenna 105) at the system's baseband frequency, a discrete/digital data sequence is determined by the frequency, amplitude, and/or phase of the signal relative to the baseband frequency. In effect, the frequency, amplitude, and/or phase can be said to constitute the symbol size of the transmission scheme.

Figure 1B:
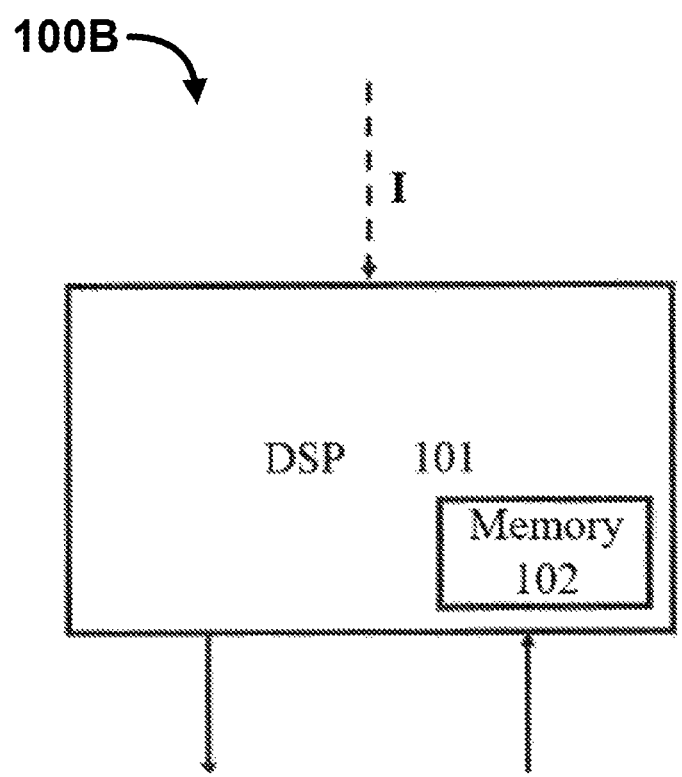
FIG. 1B is a diagram of a system for digital transmission and reception of data, in accordance with an embodiment.

FIG. 1B is a diagram showing an example hardware architecture of an "all-digital" system 100B for transmitting data (e.g., using Ethernet gframes), according to an embodiment. As in FIG. 1A, the digital signal processor (DSP) 101 is configured to receive digital data input "I," and to run a processing sequence to begin an encoding process. The encoding process can be triggered by a detection of the data input I. During encoding, the received data is temporarily stored on the DSP 101's internal storage (e.g., flash storage, one or more internal registers, dynamic random access memory (DRAM), etc.) 102 (also referred to herein as a "repository"), which can subsequently be cleared for a next data sequence. The DSP 101 can be configured to handle both encoding and decoding processes, either simultaneously or serially. In some embodiments, the DSP 101 performs its data processing according to preprogrammed execution orders (e.g., stored in the memory 102), such as those shown and discussed with reference to FIGS. 7 and 8 below. In the case of decompression, the preprogrammed execution orders can be selected based on header of a received data transmission.

Figure 2:
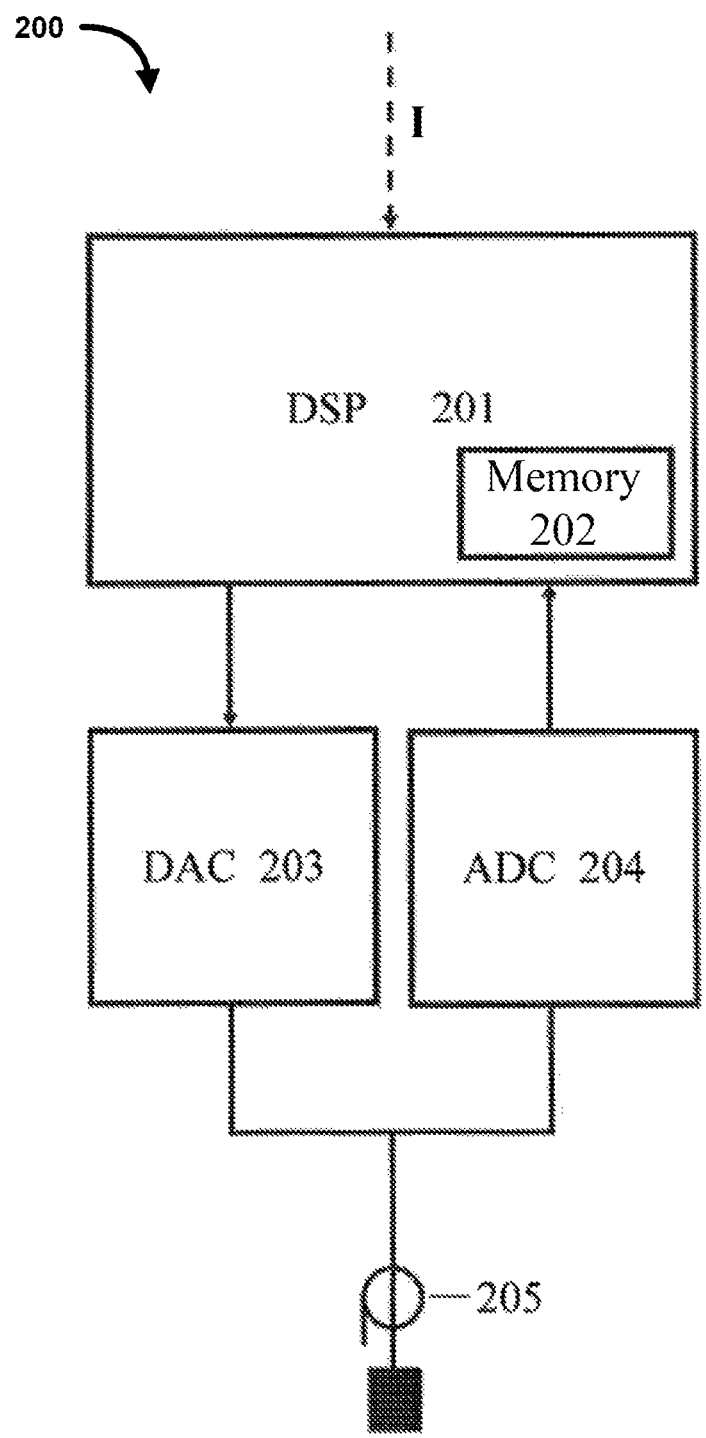
FIG. 2 is a diagram of a system for the wired transmission and reception of data using variable radio frequencies, in accordance with an embodiment.

FIG. 2 shows an example hardware architecture of a system 200 that is similar to FIG. 1, but is designed for transmitting data in a wired format. Elements 201-204 can be similar or identical to elements 101-104, respectively, with an exception that a different baseband frequency may be used in the DAC 203 and the ADC 204. A lower baseband frequency is typically used to increase performance and decrease interference on conductor cabling. Coaxial connection 205 handles the analog transmission and reception, much like antenna 105 in FIG. 1, but in wired form. The processes of encoding, decoding, and data processing described in FIG. 1 apply in FIG. 2 as well.

Figure 3:
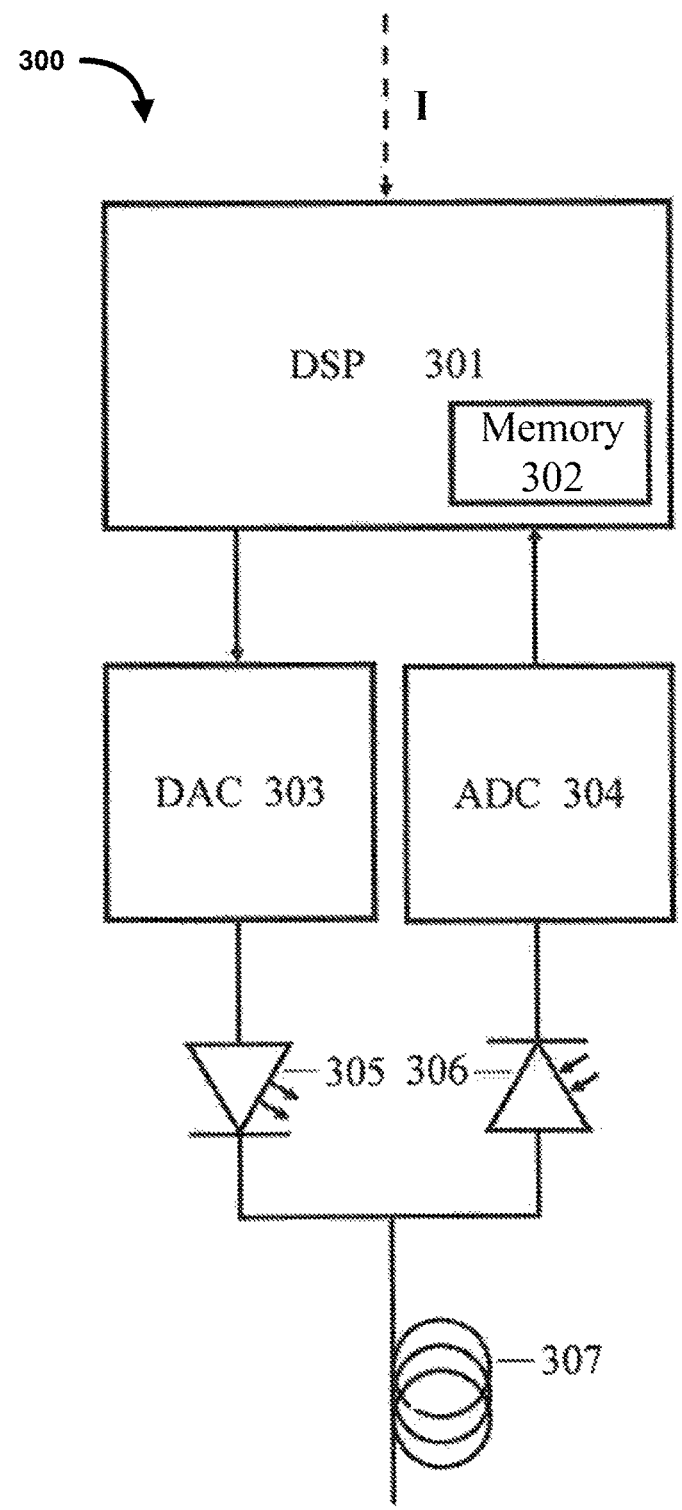
FIG. 3 is a diagram of a system for the wired transmission and reception of data using visible light, in accordance with an embodiment.

FIG. 3 shows an example hardware architecture of a system 300 that is similar to FIGS. 1 and 2, but is designed for transmitting data via light (e.g., visible or infrared, "IR") over an optical fiber. Elements 301-304 can be substantially similar or identical to elements 101-104 and elements 201-204, respectively, except that no baseband frequency is used in the embodiment of FIG. 3. During operation, light emitting diode (LED) 305 receives analog voltages from the DAC 303, and emits corresponding wavelengths of light. Also during operation, photoreceptor 306 receives a variety of wavelengths of light, and transmits associated analog voltages to the ADC 304. Optical fiber connection 307 handles the transmission and reception of analog transmissions, much like antenna 105 in FIG. 1 and coaxial connection 205 in FIG. 2, but over the visible light spectrum.

The lack of the use of a baseband frequency in the embodiment of FIG. 3 is due to the nature of LEDs and photoreceptors. Rather than using frequency, amplitude, and phase as symbol components, wavelength is used (e.g., visible shades of color, infrared). LEDs emit these different wavelengths by having corresponding direct-current (DC) voltages nm across their poles. Likewise, photoreceptors respond to different wavelengths by emitting different DC voltages across their poles. The DC nature of the current denotes that constant voltage is used, and thereby the baseband frequency is 0 Hz (i.e., is non-existent).

Figure 4:
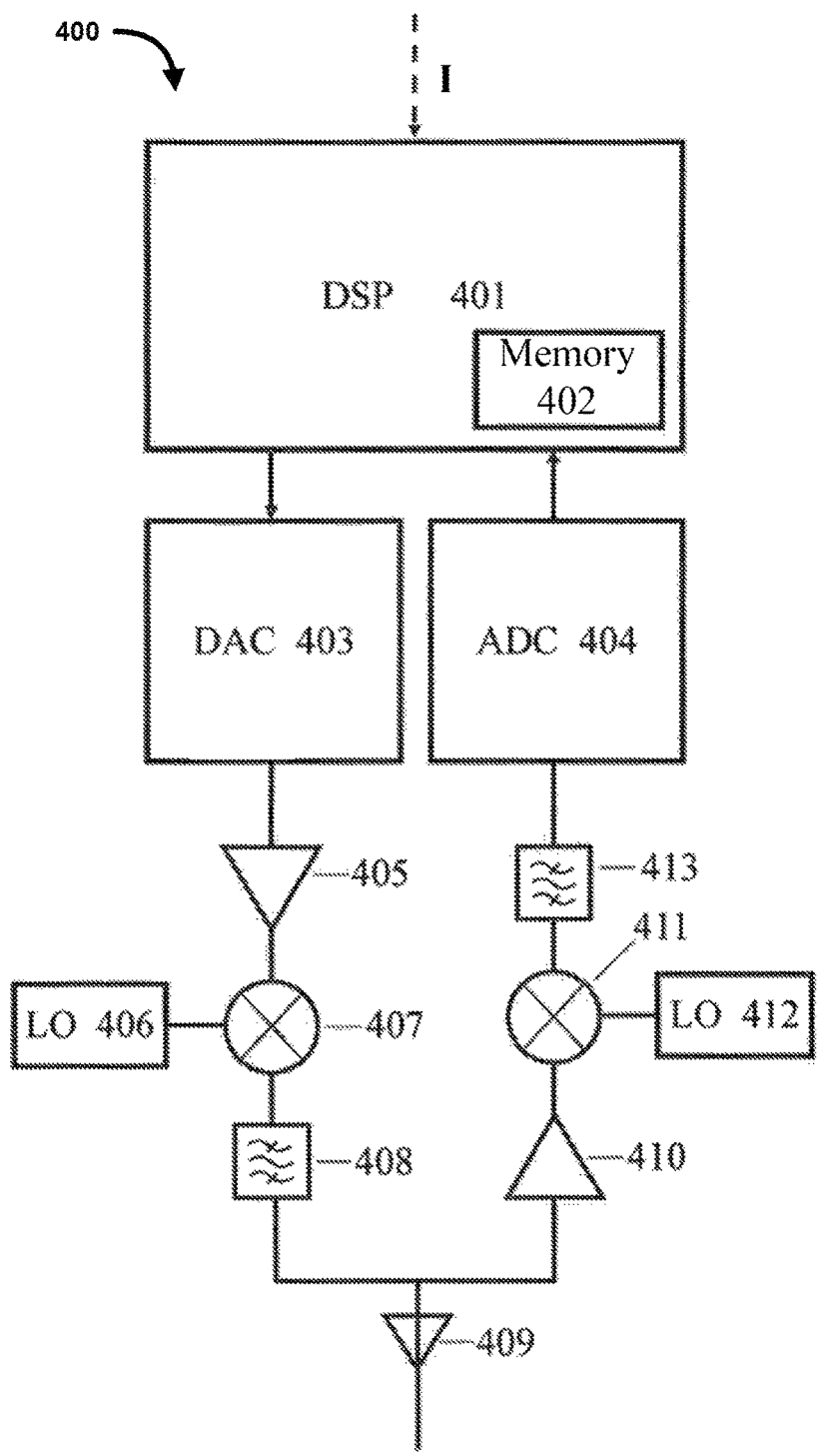
FIG. 4 is a diagram of an expanded version of the system of FIG. 1, in accordance with an embodiment.

A further example system 400 is shown in FIG. 4, and is an expansion of the embodiment of FIG. 1. Elements 401-404 (DSP 401, memory 402 DAC 403 and ADS 404) of FIG. 4 can be similar or identical to their counterparts, 101-104 in FIG. 1. Amplifier 405 is configured to increase a received signal's amplitude (power), for example to extend the range and efficiency of the wireless data transmission. During operation, local oscillator 406 and radio mixer 407 act together to step up the system's baseband frequency to operational radio frequencies. More specifically, the local oscillator 406 generates and outputs the baseband frequency (also referred to as a "carrier" frequency) signal, and the radio mixer 407 mixes the baseband signal with the data signal, thereby "stepping up" the frequency. This process, called heterodyning, allows for the use of multiple channels as well as effective operation of the system at higher frequencies. Bandpass filter 408 filters out unwanted frequencies (noise) from the radio frequency (RF) output of the local oscillator 406 and radio mixer 407, thereby increasing the quality of the signal, as well as the signal-to-noise ratio (SNR). Antenna 409 functions in a manner similar to that of antenna 105 in FIG. 1, transmitting and receiving RF signals. On the receiving (right hand) side of system 400, amplifier 410 steps up an incoming signal's power to meet the threshold of the ADC 404. Local oscillator 412 and radio mixer 411, collectively, step down the operational radio frequency to the system's baseband frequency. The bandpass filter 413 removes unwanted signals, for example to improve the quality of the signal for decoding and further processing.

Figure 5:
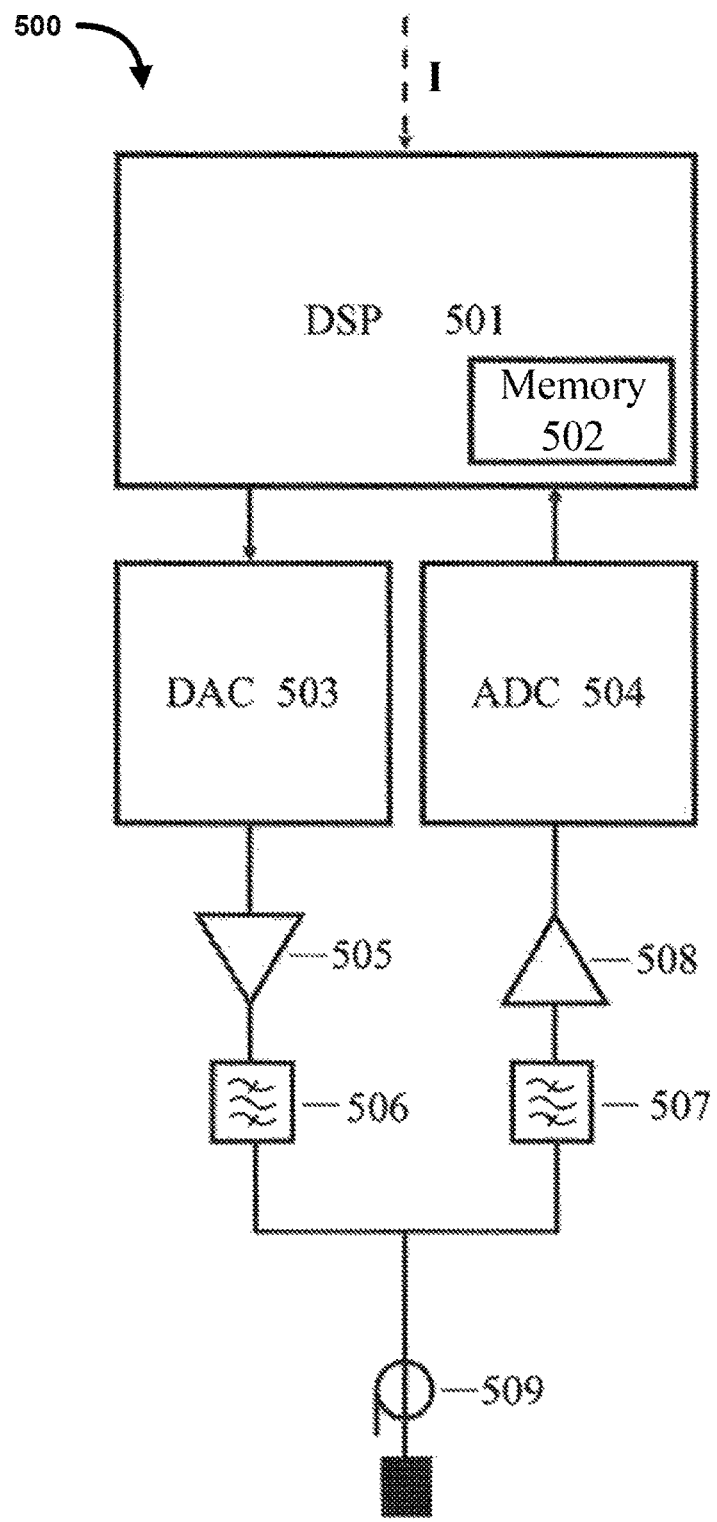
FIG. 5 is a diagram of an expanded version of the system of FIG. 2, in accordance with an embodiment.

A further example system 500 is shown in FIG. 5, and is an expansion of the embodiment of FIG. 2. Elements 501-504 (DSP 501, memory 502, DAC 503 and ADS 504) can be similar or identical to their counterparts, 201-204 in FIG. 2. During operation, amplifiers 505 and 508 increase transmitting signal amplitudes and receiving signal amplitudes, respectively, while bandpass filters 506 and 507 remove unwanted frequencies of outgoing signals and incoming signals, respectively, thereby increasing the quality of the signal and the SNR. Coaxial connector 509 is substantially similar or identical to coaxial connection 205 in FIG. 2, transmitting and receiving analog signals.

Figure 6:
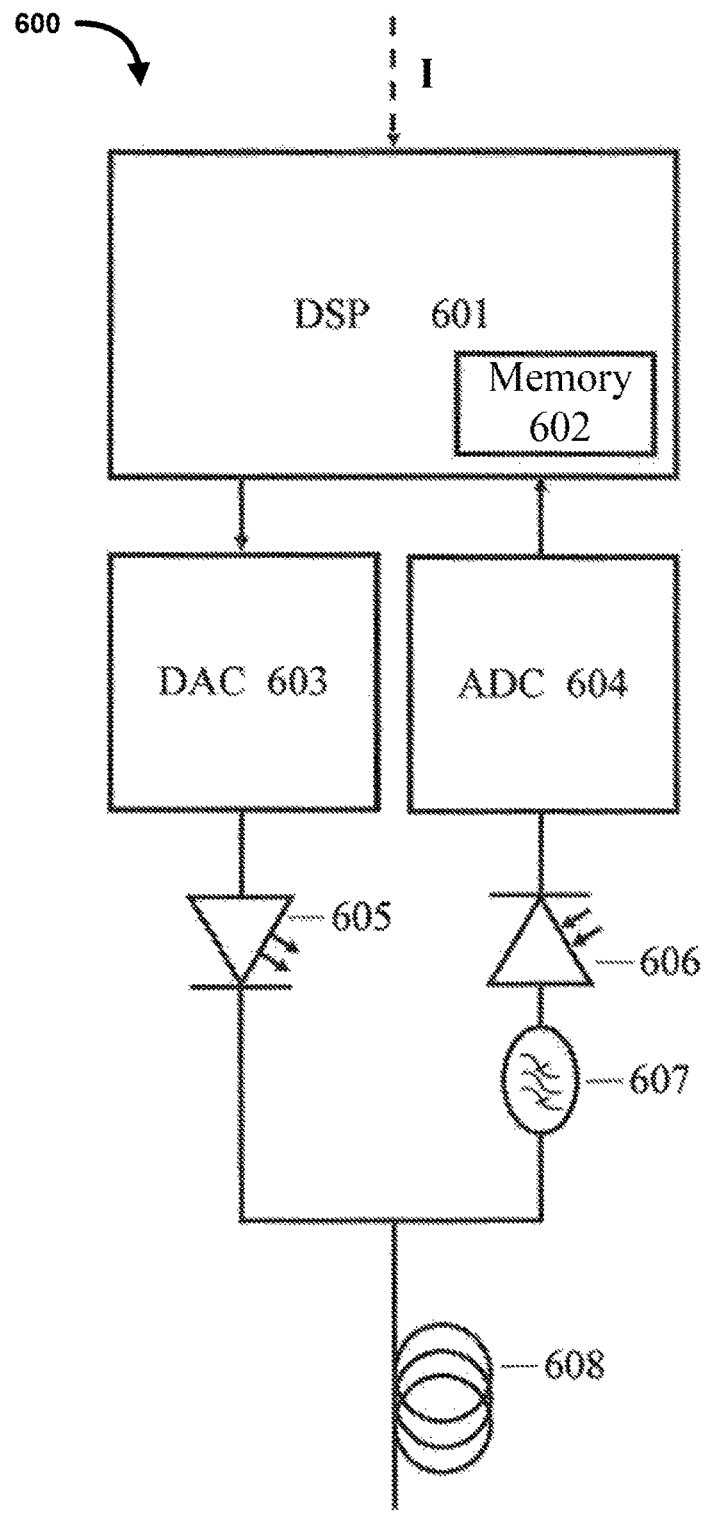
FIG. 6 is a diagram of an expanded version of the system of FIG. 3, in accordance with an embodiment.

A further example system 600 is shown in FIG. 6, and is an expansion of the embodiment of FIG. 3. Elements 601-606 (DSP 601, memory 602, DAC 603 and ADS 604) can be similar or identical to their counterparts, 301-306 of FIG. 3. During operation of the system 600, optical filter 607 removes unwanted wavelengths of light from the incoming signal, to boost SNR and the integrity of the signal. Optical fiber 608 is substantially similar or identical to optical fiber connection 307 of FIG. 3, and transmits and receives visible light signals in analog format.

Figure 7:
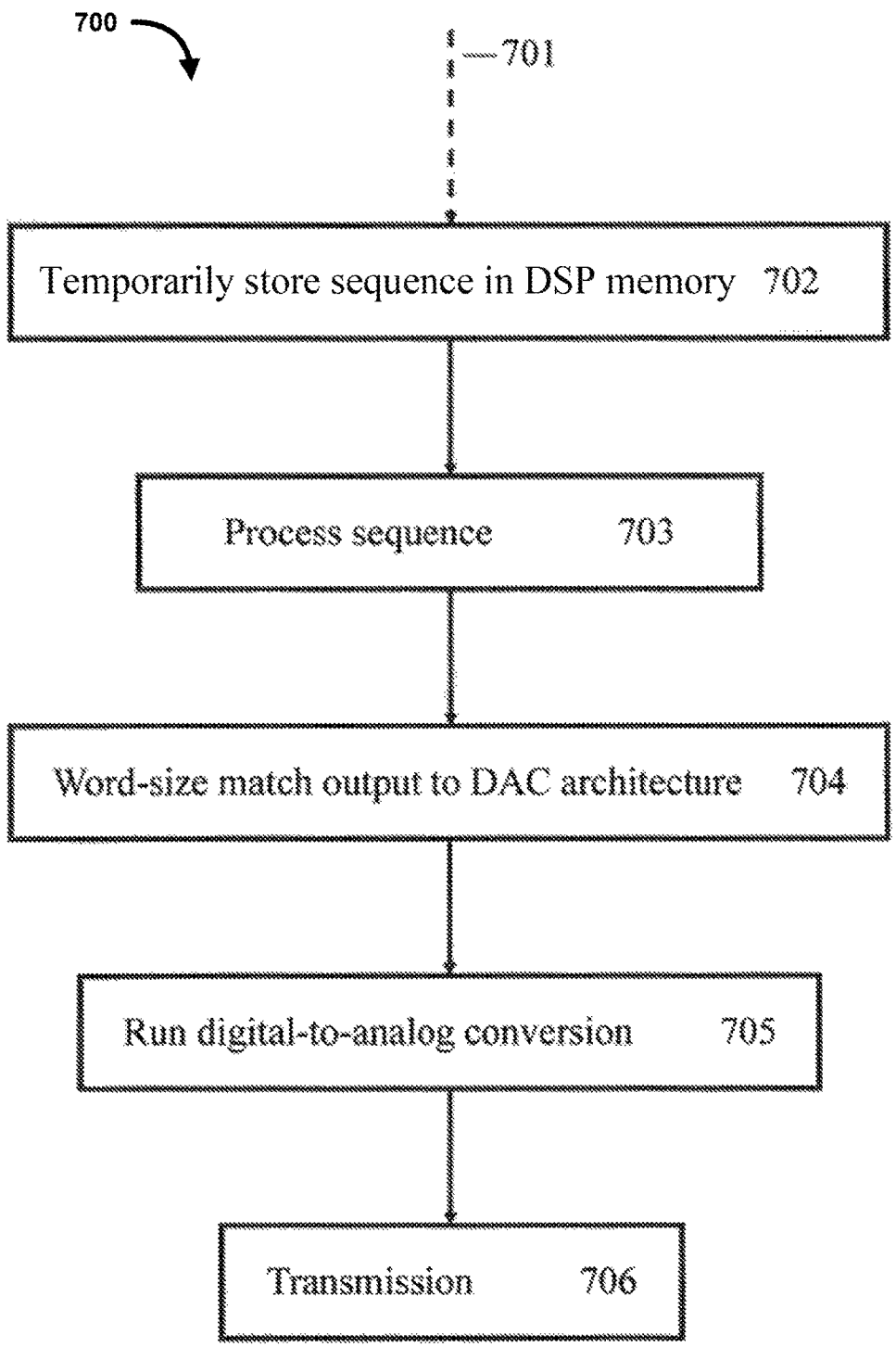
FIG. 7 is a diagram of a process flow for encoding data for transmission, in accordance with an embodiment.

FIG. 7 illustrates an overall encoding process 700 of a system (such as any system described above with reference to FIGS. 1-6), according to an embodiment. As shown in FIG. 7, an input data sequence 701 is data input from an external source. This source can be another device, a feedback loop, a serial input, a parallel input, etc. At step 702, the input sequence is stored into the digital signal processor's internal memory (e.g., flash storage). This is done, for example, to widen the scope of the sequence (i.e., to increase the entropy of that sequence, such as increasing the size of a sequence from 2 bits to 16 bits, which changes the entropy from 4 to 65,536), thereby enhancing the processing capabilities of the DSP. The received input data sequence is then processed (703), for example as shown and described with reference to FIG. 12 below. The processing (703) results in an expanded symbol size, which is then word-size matched to the DAC architecture (704). In other words, the symbol sequence is separated into smaller sequences of a size/length that matches the basic architecture of the DAC. For example, if an 8-bit DAC is in use, each of the sequences will be 8 bits of length. At step 705, a digital-to-analog conversion is performed to generate an analog signal, at which point the data sequence no longer resides in the DSP's internal storage (e.g., flash storage, one or more internal registers, dynamic random access memory (DRAM), etc.) but instead resides in the DAC. After data conversion (705), the analog signal is transmitted (e.g., wireless, wired, etc., as shown and described above with reference to FIGS. 1-6), using the appropriate circuit components.

Figure 8:
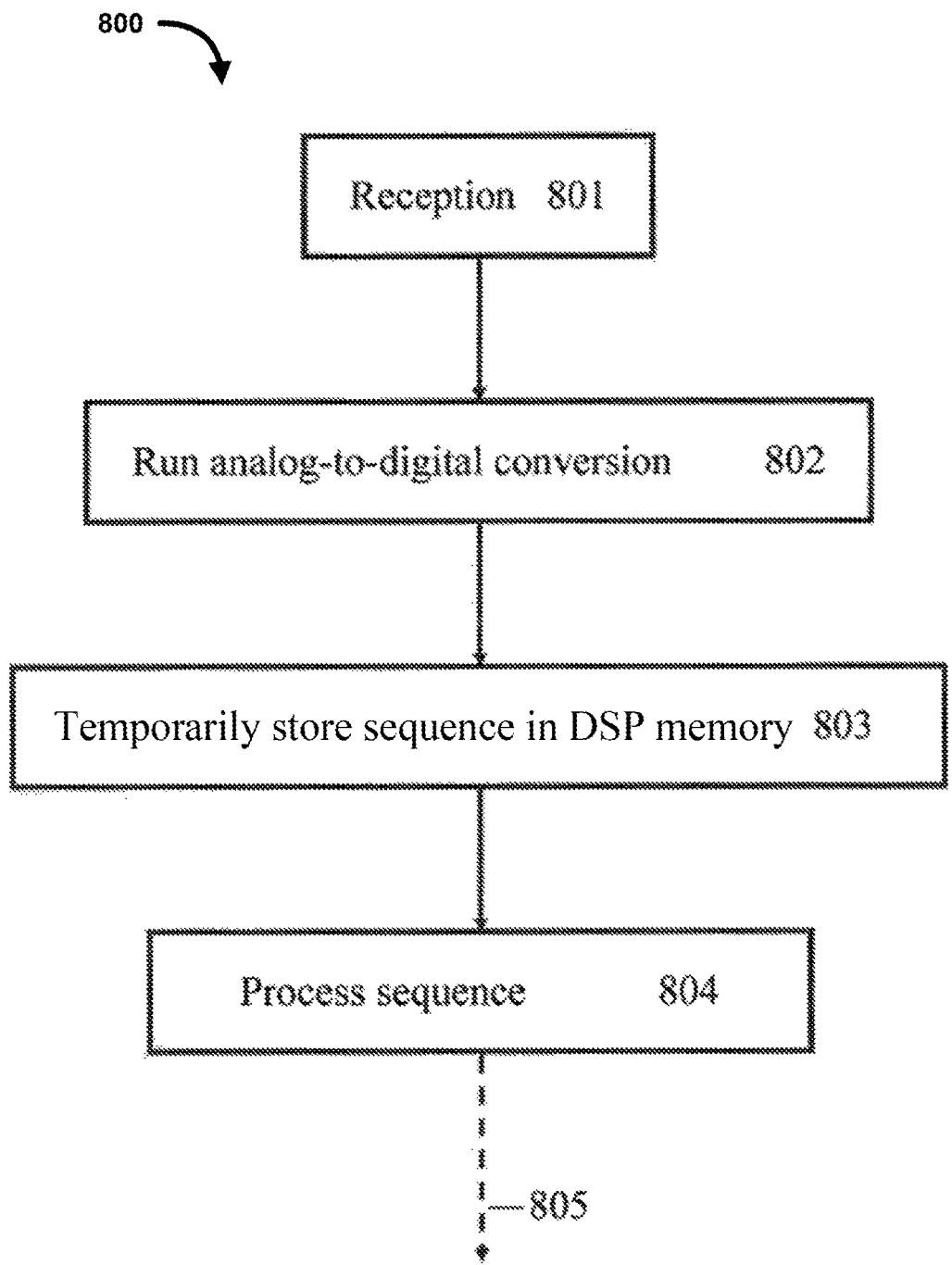
FIG. 8 is a diagram of a process flow for decoding received data, in accordance with an embodiment.

FIG. 8 illustrates an overall decoding process 800 of a system (such as any system described above with reference to FIGS. 1-6), according to an embodiment. This is effectively the reverse operation of the encoding of FIG. 7. At reception 801, an analog input is received via an antenna, coaxial connection, etc. (i.e., depending upon the transmission type, as outlined above). The received analog signal is immediately sent to the ADC for analog-to-digital conversion (802). The digitized data sequence generated by the ADC is then stored (e.g., temporarily) on the DSP's internal memory (803) before being processed (804). Details of the sequence processing (804) are discussed with reference to FIGS. 9 and 10 below. The processed data can then be output, for example to another device via a serial output, parallel output, wireless connection, etc. (805).

Data Structures Through Relative Position

Figure 11:
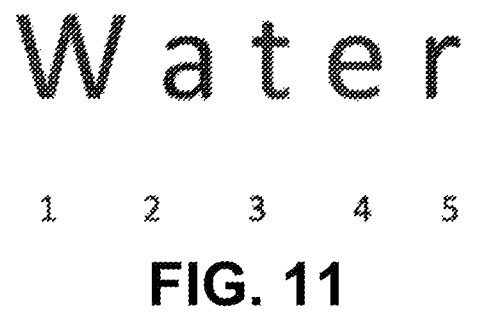

Systems of the present disclosure can transmit data having a data structure that is organized based on relative positioning of the bits within a bit stream associated therewith. The phrase "relative position" can be explained with reference to FIG. 11. As shown in FIG. 11, each letters in the word "Water" has been assigned a given number. When asked where the letter "a" is within that word, a possible answer is that "a" is in spot 2, which is its "absolute position." By contrast, according to the present disclosure, an answer to the question may instead be that the letter "a" is one space after the letter "W" and one space before "t," two spaces before "e" and three before "r." That is the "relative position" of "a," and the relative position carries significantly more information. Accordingly, data structures of the present disclosure, constructed using "relative position" information, offer an advantage over known systems in that data structures of the present disclosure provide a way to store more data than was previously possible using absolute position only. Moreover, regarding the scope of "words" with many "letters" (or, technically, sequences with many symbols), each letter/symbol can carry information about every other letter/symbol, leading to an exponential compression ratio.

Figure 10:
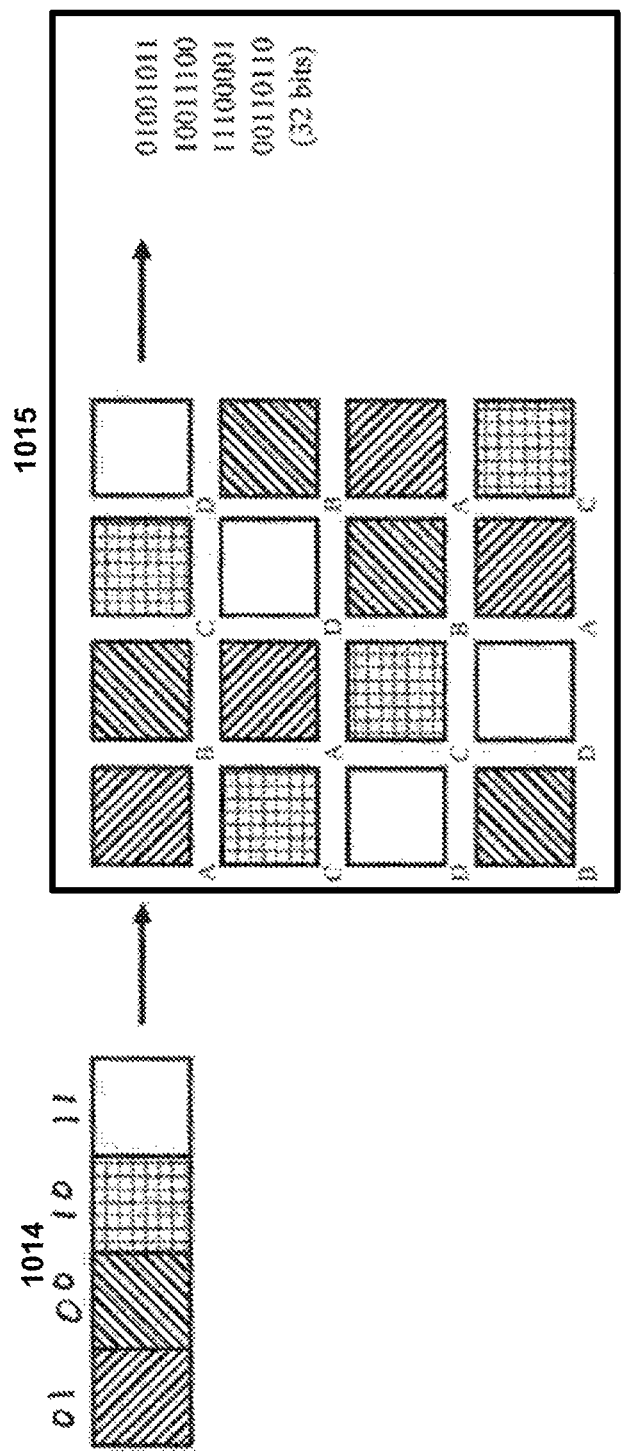
FIG. 10 illustrates a data structure, including symbols and the information that can be stored using the symbols, in accordance with an embodiment.
Figure 12:
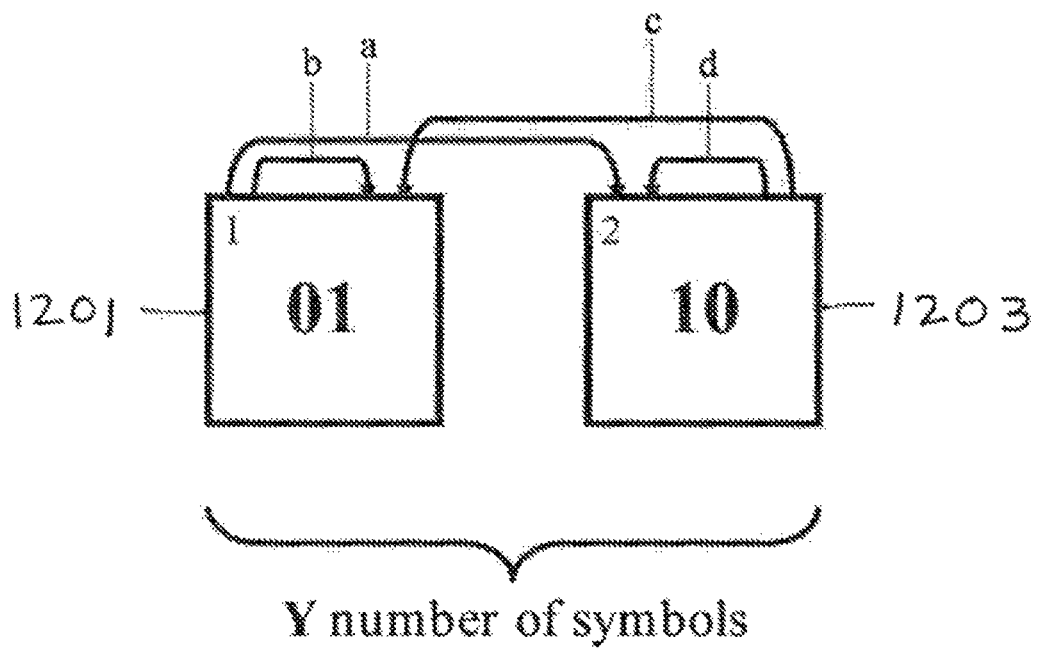
FIG. 12 illustrates symbols and the information that can be stored using the symbols, in accordance with an embodiment.

Examples of symbols and the information that can be stored using the symbols is shown in FIGS. 10 and 12. FIG. 12 shows a breakdown of the "process sequence" (804) step of FIG. 8 using two, 2-bit long symbols. The "symbols" are Box 1 (1201) and Box 2 (1203). A "symbol" may also represent a group of bits. For example, in FIG. 10, the boxes of different patterns are each a "symbol" (i.e., there are four symbols shown in FIG. 10), and two such symbols are included in FIG. 12. In the example of FIG. 12, if the symbol "01" in Box 1 (1201) represents bits, it represents not only the two bits 0 and 1, but rather 4 different possible bit patterns. "Y," in FIG. 12, denotes the number of symbols in a sequence. Position information pertaining to Box 1 of FIG. 12, relative/compared to Box 2, can be derived by the table shown in FIG. 12. As such, although Box 1 and Box 2 in FIG. 12 each carry two bits, when together in a sequence, they can each effectively carry (or represent) eight bits. The data transmission system can package symbols into a sequence and run an algorithm to obtain/generate the decompressed bit pattern sought to be transmitted.

In the case of FIG. 12, the system recognizes symbols 1201, 1203 as 01, and 10, respectively, thus converting an analog signal to a digital signal (i.e., a persistent on/off voltage) to represent these bits. The digital signal may then go from the ADC to the DSP (e.g., from ADC at step 802 to the DSP at step 803 in FIG. 8). For ease of explanation, this will be described with reference to FIG. 1A, the wireless embodiment, however it is to be understood that this processing can also/alternatively occur in corresponding structures from embodiments of FIGS. 1B, 2 and 3. FIGS. 4-6 are also embodiments of hardware for performing these processes. When data is transmitted to the DSP 101, it is stored on the internal memory 102. In some embodiments, the symbols are accumulated by the DSP 101 until two symbols (e.g., 1201, 1203) are received (although more may be accumulated in other embodiments). The example of FIG. 12 is a 2 symbol decompression, so the DSP 101 is programmed to wait until 2 symbols have been stored in memory 102 before the DSP 101 performs the expansion of the two symbols to produce the possible bit patterns. The system 100A accomplishes this by one of a variety of methods, one of which may be performing a series of comparisons of a bit's position relative to the other 3 bits. The number of comparisons can depend upon the number of bits in the symbol. Because FIG. 12 has two 2-bit symbols, there are $2^2$ possibilities (i.e., 4 possibilities) for comparisons to find information on the relative position of bits relative to one another. These 4 comparisons are represented in FIG. 12 as operations a, b, c, and d. The arrows between symbols 1201 and 1203 in FIG. 12 show the comparisons between the "0" and the "1"s of this example. The comparisons can be performed in any order (unless predetermined or pre-specified, for example by a header file), as long as it is performed consistently, i.e., according to the same set of rules for compression and decompression. In some embodiments, a header that is appended to symbols 1201 and 1203 during data transmission is used to determine the rules to be applied during decompression. For example, the header may contain a reference to a record of an addressable storage repository (e.g., a hash table, lookup table, or a C++ STL), where the record specifies an ordering of comparisons to be performed (e.g., a first ordering may be "operation b, operation c, operation a, operation d," while a second ordering may be "operation d, operation c, operation b, operation a"). In some embodiments, a given header for a data transmission including a predetermined number of symbols will have only one reference to a record in the repository specifying an ordering. In other words, one header may refer to a record specifying the first ordering, while a separate/different header (i.e., for a different data transmission) may refer to a record specifying have the second ordering. To determine the values in the "Result" column of FIG. 12, two constraints are applied: (1) a maximum size of the Result values is calculated by the total entropy of the data, $n^2$ (in this case, $2^2$=4 bits per Result value); and (2) the size of the Result values is also limited to $\log_2(n^2)$, since $\log_2(n)$ bits are needed to represent a variable that can take one of n values if n is a power of 2. Here, since the $\log_2(4)$=2, the Results are limited to 2 bits per Result value, due to the entropy of the number of comparisons. The second constraint can be included to ensure full data integrity (i.e., full representation of every possible bit pattern). The values in the Result column of FIG. 12 can be based on a function, e.g., a logic function such as exclusive-or ("XOR"), AND, OR, etc., a concatenation, or any other arbitrary function, as defined within the addressable storage repository. As such, the Results values in FIG. 12 could be any of 00, 01, 10, or 11, depending upon the function applied during the symbol comparison step of the decompression process.

Comparison "a" in FIG. 12 includes comparing the "0" of the first symbol 1201 to the "0" of the second symbol 1203. Comparison "b" includes comparing the "0" of 1201 to the "1" of 1201, and so forth for "c" and "d." In this manner, each bit is represented not just as its absolute position (i.e., first bit, second bit, third bit, etc.), but also as its position relative to what bits surround or are near to it, as described with reference to FIG. 11. The relative position information may be stored in memory.

Figure 9:
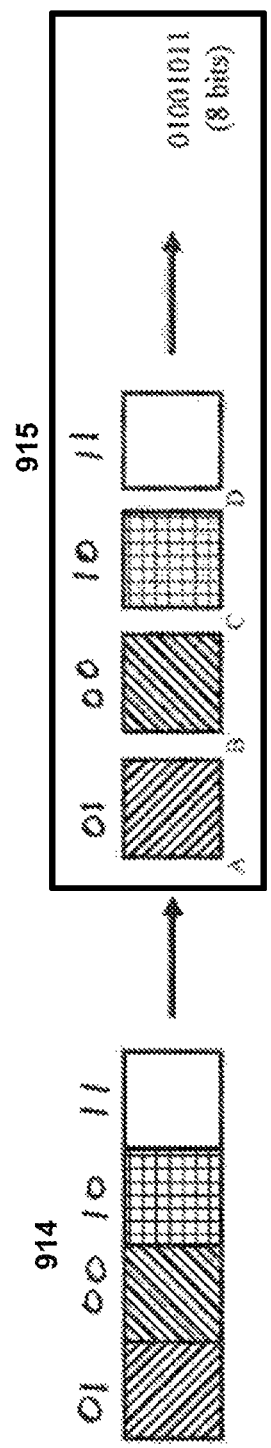
FIG. 9 illustrates a known data structure.

An advantage to using relative position in a data structure is that a simple 8-bit sequence can represent a much longer bit sequence. To illustrate this advantage, compare FIG. 9 with FIG. 10. FIG. 9 illustrates a known data structure 914, in which a given 8-bit pattern (01001011) represents only itself. In other words, the data received after transmission thereof (at 915) includes only the original 8-bit pattern (i.e., "01001011"). Previous to the present disclosure, there were no known ways to efficiently "compress" or make such a bit pattern represent a larger bit pattern. FIG. 10, in contrast to FIG. 9, shows that by using the information stored in the comparison process explained with reference to FIGS. 11 and 12, a 8-bit data transmission 1014 ("01001011") can be used to represent a larger number of bits (e.g., 32 bits: "01001011100111001110000100110110"). In other words, the data obtained after transmission of the 8-bit data 1014, and after decompression thereof (e.g., using the header, not shown in FIG. 10, included in the transmission of the 8-bit data 1014 and an associated repository of ordering instructions (not shown)), is 32 bits in size (see 1015 in FIG. 10). In FIGS. 9 and 10, each pattern/box represents a symbol of a given bit pattern that is 2 bits long. Longer bit patterns are possible, but a two-bit bit pattern is used for ease of explanation. The boxes have various patterns to illustrate that they differ from one another. The left diagonal pattern represents 01, the right diagonal pattern represents 00, the grid represents 10, and the blank box represents 11. Each such pattern (diagonal, grid, etc.) is like a piece of a jigsaw puzzle. In FIG. 9, four puzzle pieces of different patterns are provided, with one piece in each respective absolute position, amounting to a total of four spots filled with the four patterns given. By contrast, as shown in FIG. 10, by using relative position in the data structure (e.g., as represented by the information in the header), the system analyzes not only the absolute positions of the patterns, but also the relative positions of each pattern with respect to the other patterns. Placing the right diagonal pattern, for example when it is given in a specific order, will also place the left diagonal, grid, and blank patterns because information referenced by the header is stored in a storage repository as to those patterns' positions relative to the right diagonal pattern.

According to the present disclosure, and depending upon the implementation, signals representing symbols are transmitted through one of a variety of architectures (such as those shown and described with reference to FIGS. 1-6 above). When a signal representing one or more symbols arrives at an ADC (e.g., as an alpha demodulation, flash demodulation, etc.), for example in the fiber optic embodiment of FIG. 3 or FIG. 6), a light receiving diode and/or a CMOS sensor may be triggered. The ADC, referring to a storage repository (e.g., a hash table, a lookup table, or a C++ Standard Template Library (STL)), outputs the representative binary representations for each received symbol. For example, the DAC may determine that the color red="01." In FIG. 7, 701 will be the first received signal modulation, followed by 702, which could be for example a given frequency or color, ex. blue. This is the example for an analog-to-digital conversion. The processing may also occur as follows: the symbol arrives as a signal modulation through either a co-axial cable (e.g., cable 205 in FIG. 2, for example as an RF modulation), a fiber (e.g., optical fiber 305 in FIG. 3, for example via a light flash), or an antenna (e.g., antenna 105 of FIG. 1, as an RF modulation). Antennas typically handle high frequency signals, while co-axial cable handles lower frequencies. A symbol, therefore, may be a modulated signal (i.e., a signal that differs from the base band signal and represents something different than the base band signal). What is received, therefore, are the symbols "Box 1" and "Box 2," in these forms. In some embodiments, if the signal is received through RF, it will be as a frequency.

Variations to the foregoing embodiments are also contemplated by the present disclosure. For example, in FIG. 10, there are four symbols. Each of these four symbols may represent two bits, as in FIG. 12, or more than two bits (e.g., four, eight, or sixteen bits). If each symbol is two bits long (as in the example of FIG. 10), the simple bit pattern 01001011 can represent more than just 10001011, but rather 32 bits 01001011100111001110000100110110 (as shown on the right hand side of FIG. 10). More or fewer symbols can be used, however, and more than two symbols may be stored and processed prior to outputting a compressed or decompressed bit pattern, depending on the direction of the transmission. Additional details of embodiments of the present disclosure can be found in U.S. Pat. No. 8,941,513, U.S. Pat. No. 9,124,295, and U.S. Pat. No. 9,419,716, each of which is incorporated by reference herein in its entirety.

Information Theory & Example

Figure 13:
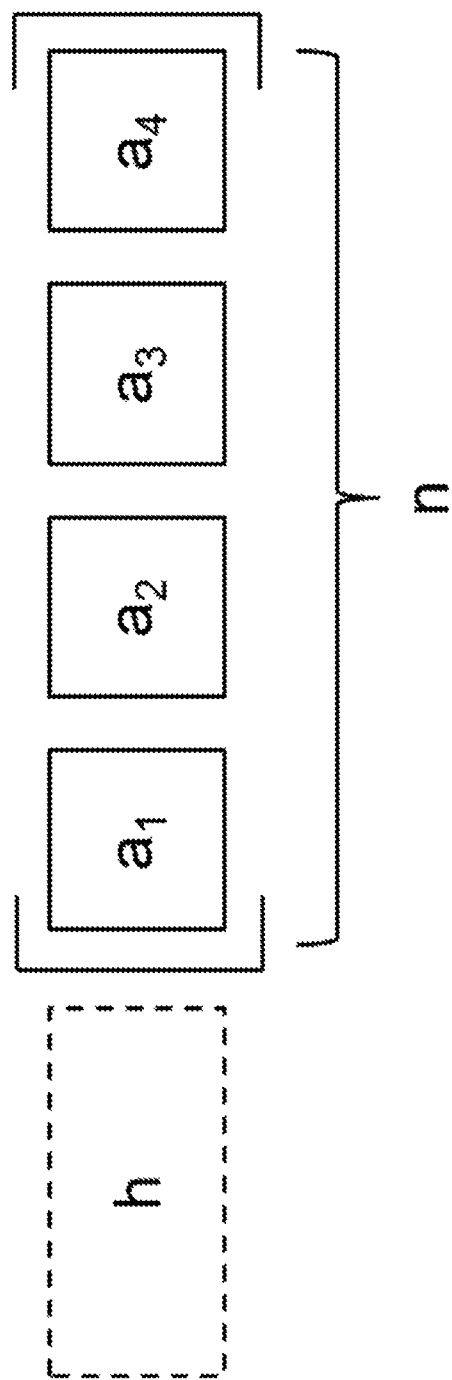
FIG. 13 illustrates a data structure showing how bits can be described by virtue of their position relative to other bits in a sequence, in accordance with an embodiment.

As discussed throughout the present disclosure, the concept of relative positioning, when applied to data transfer, can result in greatly enhanced efficiencies in data transmission. FIG. 13 shows an example frame of what a compressed transmission can include, according to some embodiments. As shown in FIG. 13, a number "n" of data units of a given size "a" are transmitted in a single sequence, preceded by a header "h." A series of comparisons can then be executed on the sequence. For example, each unit can be compared against itself and all others, such that a total number of comparisons performed is the square of the total number of units in the sequence ($n^2$), and a result "r" can be output for each comparison, with "r" being the output of an arbitrary (but predefined, both at the transmitter and at the receiver) function $f(a_a, a_b)$. In some such embodiments, the header "h" includes a reference to an addressable storage repository (e.g., a hash table, lookup table, or a C++ STL), where each record of a plurality of records in the storage repository contains information that specifies an order in which the comparisons are to occur. For example, the header "h" can be programmed as a bitset storing a plurality of bits, the bitset having a size calculated as set forth in Equation (1.2) below. Every bit combination possibility in the bitset can be mapped to (i.e., reference) a given order (e.g., in a C++ STL). The comparison data for the data units ($a_1$, $a_2$, $a_3$ and $a_4$) of FIG. 13 is shown in FIG. 14 (see rows C1 through C16).

Upon the successful completion of all comparisons on a given sequence, e.g., according to the order specified by the mapping of the header bitset, the outputs (or "results") "r" can be expanded by concatenation, the result of which is $\Sigma r$ (see equation (1.1), below), also known as "information gain."

$$\Sigma r = r_1 \| r_2 \| r_1 \| \ldots \| r_n \quad (1.1)$$

information gain=$\Sigma r$

In some embodiments, in which the header "h" determines the order of comparisons, a length of "h" (header length) is equal to the $\log_2(n^2!)$, rounded up (as denoted by the "ceil" value shown in equation (1.2) below). With $n^2$ being the total number of comparisons, its factorial will determine the total number of permutations thereof (i.e., the number of unique combinations of $a_a$ and $a_b$, each such comparison leading to one of r1 through r16, in FIG. 14).

$$\text{header} = \text{ceil}(\log_2(n^2!)) \qquad (1.2)$$

Equation (1.3), below, describes the decompression process (also referred to herein as "expansion of data") according to some embodiments. During decompression, the header information can be used to retrieve information specifying an order in which the comparisons are to occur from the addressable repository (e.g., a hash table or C++ STL). The information efficiency ($\eta$) is determined by:

$$\eta = \frac{\text{information gain} - \text{header}}{\text{original information}} = \frac{\Sigma r \sim \text{ceil}(\log_2(n^2!))}{(a)(n)} \qquad (1.3)$$

Relative Positioning—Applied Example

Figure 15:
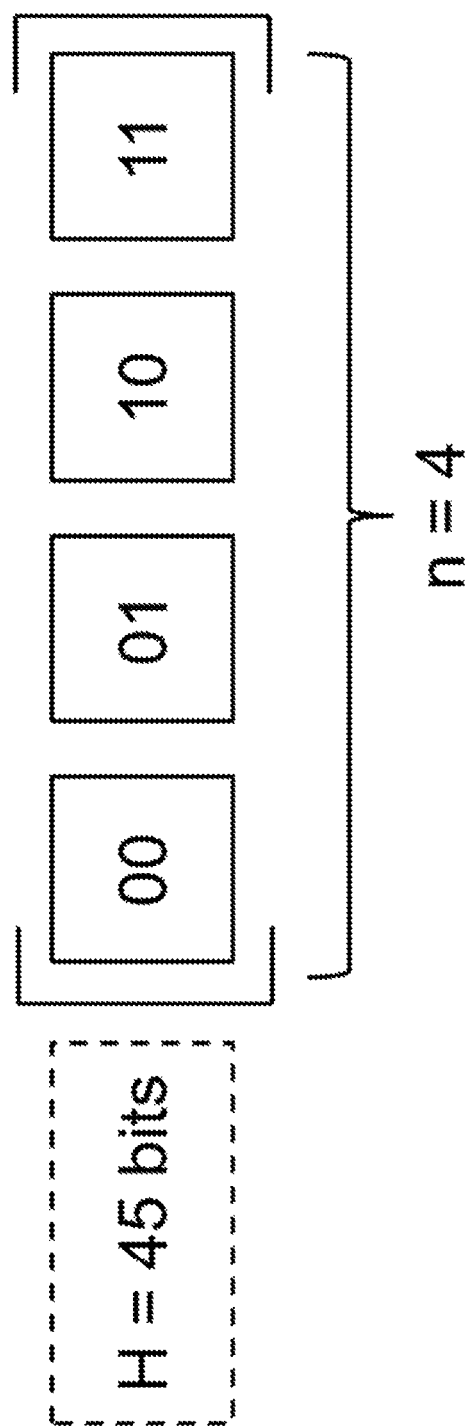
FIG. 15 illustrates an applied example of relative positioning, in accordance with an embodiment.

An applied example of relative positioning, in accordance with some embodiments, is shown and described with reference to FIGS. 15 and 16. As shown in FIG. 15, a data sequence can include 4 units/symbols (i.e., n=4) having 2 bits each, and a header having 45 bits. The comparison data for the data units of FIG. 15 is shown in FIG. 16 (see rows D1 through D16), and the header and information efficiency calculations are shown at (1.4) and (1.5) below. The Shannon entropy of the 45-bit header is calculated as $2^{45}$, since each bit represents a binary value. This means that the 45-bit header can hold any of $2^{45}$ unique addresses, each referencing a data decompression permutation stored in the addressable storage repository.

$$\text{header} = \text{ceil}(\log_2(n^2!)) = \text{ceil}(\log_2(16!)) = \text{ceil}(44.25) = 45 \text{ bits} \qquad (1.4)$$

$$\eta = \frac{\Sigma r \sim \text{ceil}(\log_2(n^2!))}{(a)(n)} = \frac{64 - 65}{(2)(4)} = 2.375:1 = 237.5\% \qquad (1.5)$$

As shown in (1.5), the result of using relative positioning is significant. In this applied example, an information efficiency of 237.5% is obtained. Per Equation (1.5), efficiency $\eta$ increases as header size increases (by a linear function), since as "n" increases, the effective volume of data represented by the data units grows (by a linear+logarithmic growth function) faster than the header size does. Significantly larger outcomes can be achieved by using larger base figures, as shown in Appendices A & B. Moreover, in some embodiments (e.g., over large transmission periods), a header of one sequence can be included as part of the information content of a preceding sequence, thereby reducing overall redundancy and further increasing the density of carried information. As n increases, the compression ratio increases exponentially.

Although the foregoing discussion of FIGS. 13-16 focused on demonstrating decompression processes, rather than compression processes (for ease of conceptual and mathematical illustration), the present disclosure also contemplates data compression using the techniques that relate to, and are compatible with, those of FIGS. 13-16.

All combinations of the foregoing concepts and additional concepts discussed herewithin (provided such concepts are not mutually inconsistent) are contemplated as being part of the inventive subject matter disclosed herein. The terminology explicitly employed herein that also may appear in any disclosure incorporated by reference should be accorded a meaning most consistent with the particular concepts disclosed herein.

The drawings primarily are for illustrative purposes and are not intended to limit the scope of the subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

To address various issues and advance the art, the entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. They are presented to assist in understanding and teach the embodiments.

It should be understood that the embodiments set forth herein are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

Various inventive concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisionals, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

While specific embodiments of the present disclosure have been outlined above, many alternatives, modifications, and variations will be apparent. Accordingly, the embodiments set forth herein are intended to be illustrative, not limiting. Various changes may be made.

The invention claimed is:
1. A system, comprising:
a non-transitory memory configured to store bit position information including absolute position data and relative position data for each bit of a plurality of bits of the first data;
a processor in operable communication with the memory, the processor configured to:
receive a data stream including the first data, and
compress the first data to generate a second data representing the first data, the second data having a data structure that is arranged based on: (1) the first data, and (2) the bit position information;
a digital-to-analog converter (DAC) configured to receive a digital representation of the second data from the processor and convert the digital representation of the second data into an analog representation of the second data; and a transmitter coupled to the DAC and configured to transmit the analog representation of the second data, the relative position data for each bit from the plurality of bits of the first data representing comparisons of that bit with each other bit from the plurality of bits of the first data.

2. The system of claim 1, wherein the transmitter includes an antenna, and the analog representation of the second data is transmitted wirelessly.

3. The system of claim 1, wherein the transmitter includes a coaxial cable, and the analog representation of the second data is transmitted over wire.

4. The system of claim 1, wherein the transmitter includes an optical fiber, and the analog representation of the second data is transmitted optically.

5. A method, comprising:

receiving, at a processor, a data stream including a first data;

transforming, at the processor, the first data into a second data including a compressed version of the first data, the second data having a data structure that is arranged based on: (1) the first data; and (2) relative bit position information; and sending a digital representation of the second data to a converter that causes the second data to be transmitted after receiving the second data, the transforming including partitioning the second data into a plurality of symbol sequences, each symbol sequence of the plurality of symbol sequences having a length that is compatible with the converter.

6. The method of claim 5, the second data being transmitted via one of a wireless transmission, a wired transmission, or an optical transmission.

7. A method, comprising:

receiving, at a processor and from an analog-to-digital converter (ADC), a digital representation of a first data;

storing the digital representation of the first data in a non-transitory memory, the memory in operable communication with the processor; and decompressing, at the processor, the first data into a second data based on: (1) the first data, and (2) relative bit position information stored in the memory, the bit position information including relative positions of each bit from a plurality of bits of the first data with respect to each other bit from the plurality of bits, the first data including a plurality of symbols and a header, the decompressing the first data further including comparing each symbol from the plurality of symbols with each other symbol from the plurality of symbols, the header specifying an ordering of the comparing.

8. The method of claim 7, the method further comprising waiting until a predetermined number of symbols have been stored in the memory before decompressing the first data into the second data.

9. The method of claim 7, wherein the header has a length based on a number of symbols in the plurality of symbols.

10. A method, comprising:

receiving, at a processor and from an analog-to-digital converter (ADC), a digital representation of a first data;

storing the digital representation of the first data in a non-transitory memory, the memory in operable communication with the processor; and decompressing, at the processor, the first data into a second data based on: (1) the first data, and (2) relative bit position information stored in the memory, the relative bit position information including relative positions of each bit from a plurality of bits of the first data with respect to each other bit from the plurality of bits, the decompressing the first data further including comparing each symbol from a plurality of symbols of the first data with each other symbol from the plurality of symbols, and a number of comparisons is based on a number of bits in each symbol from the plurality of symbols.

11. The method of claim 10, the method further comprising waiting until a predetermined number of symbols have been stored in the memory before decompressing the first data into the second data.

12. The method of claim 10, wherein the first data includes a header having a length based on a number of symbols in the plurality of symbols.

13. A system, comprising:

a non-transitory memory configured to store:

bit position information including absolute position data and relative position data for each bit of a plurality of bits of the first data, and a plurality of addressable records, each addressable record of the plurality of addressable records specifying an ordering of bit comparisons;

a processor in operable communication with the non-transitory memory, the processor configured to:

receive a data stream including the first data, and compress the first data, based on the ordering of bit comparisons, to generate a second data representing the first data, the second data having a data structure that is arranged based on: (1) the first data, and (2) the bit position information;

a digital-to-analog converter (DAC) configured to receive a digital representation of the second data from the processor and convert the digital representation of the second data into an analog representation of the second data; and a transmitter configured to transmit the analog representation of the second data.

14. The system of claim 13, wherein the transmitter includes an antenna, and the transmitter is configured to transmit the analog representation of the second data wirelessly.

15. The system of claim 13, wherein the transmitter includes a coaxial cable, and the transmitter is configured to transmit the analog representation of the second data over wire.

16. The system of claim 13, wherein the transmitter includes an optical fiber, and the transmitter is configured to transmit the analog representation of the second data optically.

17. A method, comprising:

receiving, at a processor and from an analog-to-digital converter (ADC), a digital representation of a first data;

storing the digital representation of the first data in a non-transitory memory, the memory in operable communication with the processor; and decompressing, at the processor, the first data into a second data based on: (1) the first data, and (2) relative bit position information stored in the memory, the bit position information including relative positions of each bit from a plurality of bits of the first data with respect to each other bit from the plurality of bits, the first data including a plurality of symbols and a header, the header including a reference to a record of the memory, the record specifying an ordering of bit comparisons, the decompressing further based on the ordering of bit comparison.

18. The method of claim 17, the method further comprising waiting until a predetermined number of symbols have been stored in the memory before decompressing the first data into the second data.

19. The method of claim 17, wherein the header has a length based on a number of symbols in the plurality of symbols.

* * * * *